United States Patent
Chang (10) Patent No.: US 10,085,560 B1
(45) Date of Patent: Oct. 2, 2018

(54) SLIDE RAIL DISPLACEMENT POSITIONING MECHANISM

(71) Applicant: Nan Juen International Co., Ltd., New Taipei (TW)

(72) Inventor: Fu-Tien Chang, New Taipei (TW)

(73) Assignee: NAN JUEN INTERNATIONAL CO., LTD., New Taipei (TW)

( * ) Notice: Subject to any disclaimer, the term of this patent is extended or adjusted under 35 U.S.C. 154(b) by 0 days.

(21) Appl. No.: 15/620,811

(22) Filed: Jun. 12, 2017

(51) Int. Cl.
| | |
|---|---|
| *A47F 5/00* | (2006.01) |
| *A47B 88/477* | (2017.01) |
| *A47B 88/49* | (2017.01) |
| *A47B 88/43* | (2017.01) |
| *H05K 7/18* | (2006.01) |
| *H05K 7/14* | (2006.01) |

(52) U.S. Cl.
CPC .......... *A47B 88/477* (2017.01); *A47B 88/43* (2017.01); *A47B 88/49* (2017.01); *H05K 7/1489* (2013.01); *H05K 7/183* (2013.01)

(58) Field of Classification Search
CPC ....... A47B 88/477; A47B 88/43; A47B 88/49; H05K 7/1489; H05K 7/183; F16C 29/12; F16C 29/004
USPC ...................................................... 248/298.1
See application file for complete search history.

(56) References Cited

U.S. PATENT DOCUMENTS

| | | | | |
|---|---|---|---|---|
| 6,578,939 | B1* | 6/2003 | Mayer .................... | A47B 88/43 312/334.5 |
| 9,328,769 | B1* | 5/2016 | Chen ..................... | H05K 7/1489 |
| 2001/0040142 | A1* | 11/2001 | Haney .................. | H05K 7/1421 211/183 |
| 2006/0152115 | A1* | 7/2006 | Dubon ................. | H05K 7/1489 312/334.8 |
| 2009/0283652 | A1* | 11/2009 | Chen ..................... | H05K 7/1489 248/298.1 |
| 2014/0217049 | A1* | 8/2014 | Chen ..................... | H05K 7/1489 211/195 |
| 2017/0082143 | A1* | 3/2017 | Chen ....................... | F16C 29/12 |
| 2017/0095078 | A1* | 4/2017 | Chen ..................... | H05K 7/1489 |

* cited by examiner

Primary Examiner — Christopher Garft (57) ABSTRACT

A slide rail displacement positioning mechanism includes a slide rail assembly and a stent unit and a positioning member respectively connected to the slide rail assembly such that when connecting the stent unit to an external bracket, a first support member and a second support members of the tent unit moved relative to each other to the best fit position for allowing the second support member be affixed to the bracket, and then the relative positioning condition between the first support member and the second support member is released for allowing movement of the first support member toward the second support member for fixation to another external bracket. Thus, the slide rail displacement positioning mechanism fits any of various different widths between two opposite brackets.

3 Claims, 7 Drawing Sheets

SLIDE RAIL DISPLACEMENT POSITIONING MECHANISM

BACKGROUND OF THE INVENTION

1. Field of the Invention

The present invention relates to sliding rail technology and more particularly to a slide rail displacement positioning mechanism, which allows locking/unlocking and adjustment of a stent unit to facilitate installation between two brackets.

2. Description of the Related Art

When installing a slide rail assembly in a rack-mounted computer server system, the slide rail assembly is mounted in a stent unit, and then the two ends of the stent unit are respectively fastened to two opposite brackets in the server system. In order to fit the width between the two brackets, the stent unit is slidably coupled to the slide rail so that the stent unit can be extended out of or retracted to fit the width between the two brackets. However, since the stent unit is retractable, it can slide during installation in the brackets, making the installation of the stent unit difficult.

SUMMARY OF THE INVENTION

Embodiments of the present invention have been accomplished under the circumstances in view. It is therefore the main object of the present invention to provide a slide rail displacement positioning mechanism, which utilizes a positioning member that is pivotally connected to the slide rail assembly for allowing connection of a stent unit between two brackets in such a manner that when connecting the stent unit to one bracket, a first support member and a second support member of the stent unit are moved relative to each other to facilitate fixation of the second support member to one bracket, and then the first support member and the second support member are unlocked by means of the operation of the slide rail assembly for allowing movement of the first support member toward the second support member and further fixation to the other bracket. Thus, the slide rail displacement positioning mechanism fits any of various different widths between two opposite brackets.

To achieve this and other objects of the present invention, a slide rail displacement positioning mechanism comprises a slide rail assembly, a stent unit and a positioning member. The slide rail assembly comprises an outer slide rail and an intermediate slide rail axially slidably coupled to and movable in and out of the outer slide rail. The outer slide rail comprises a through hole. The intermediate slide rail comprises a rib located on a bottom wall thereof to face toward the outer slide rail. The stent unit is mounted at an outer side of the outer slide rail of the slide rail assembly remote from the intermediate slide rail, comprising a first support member affixed to one end of the outer slide rail and a second support member coupled to an opposite end of the outer slide rail remote from the first support member and movable in and out of the outer slide rail. The second support member comprises a position-limiting slot. The position-limiting slot comprises an activity space disposed near the first support member, a position-limiting space disposed in communication with one side of the activity space, and a stop edge defined between the activity space and the position-limiting space. Further, the width of the activity space is larger than the width of the position-limiting space. The positioning member comprises a position-limiting plate, and an abutment plate extending from the position-limiting plate. The position-limiting plate is pivotally connected to an outer side of the outer slide rail of the slide rail assembly remote from the intermediate slide rail in such a manner that the position-limiting plate is disposed in the position-limiting slot of the stent unit and the abutment plate is inserted through the through hole toward the intermediate slide rail; the width of the position-limiting plate is less than the width of the position-limiting space of the position-limiting slot. When the second support member is extended along the outer slide rail in a direction away from the first support member, the position-limiting plate is moved out of the position-limiting space into the activity space to bias the position-limiting plate into abutment against an side edge of the activity space for allowing movement of the second support member along the outer slide rail in a direction toward the first support member so that when the position-limiting plate is abutted against the stop edge, the second support member is prohibited from movement toward the first support member and, when the intermediate slide rail is extended out of the outer slide rail, the rib is forced against the abutment plate to move the position-limiting plate away from the stop edge into alignment with the position-limiting space for allowing movement of the second support member along the outer slide rail toward the first support member.

Since the second locating member can be installed when the stent unit is locked in position, the user can connect the second locating member to the bracket easily. After connection between the second locating member and the respective bracket, the stent unit is unlocked for allowing movement between the first support member and the second support member and further fixation of the first locating member to the other bracket, and thus, the invention facilitates application.

DETAILED DESCRIPTION OF THE PREFERRED EMBODIMENT

Figure 1:
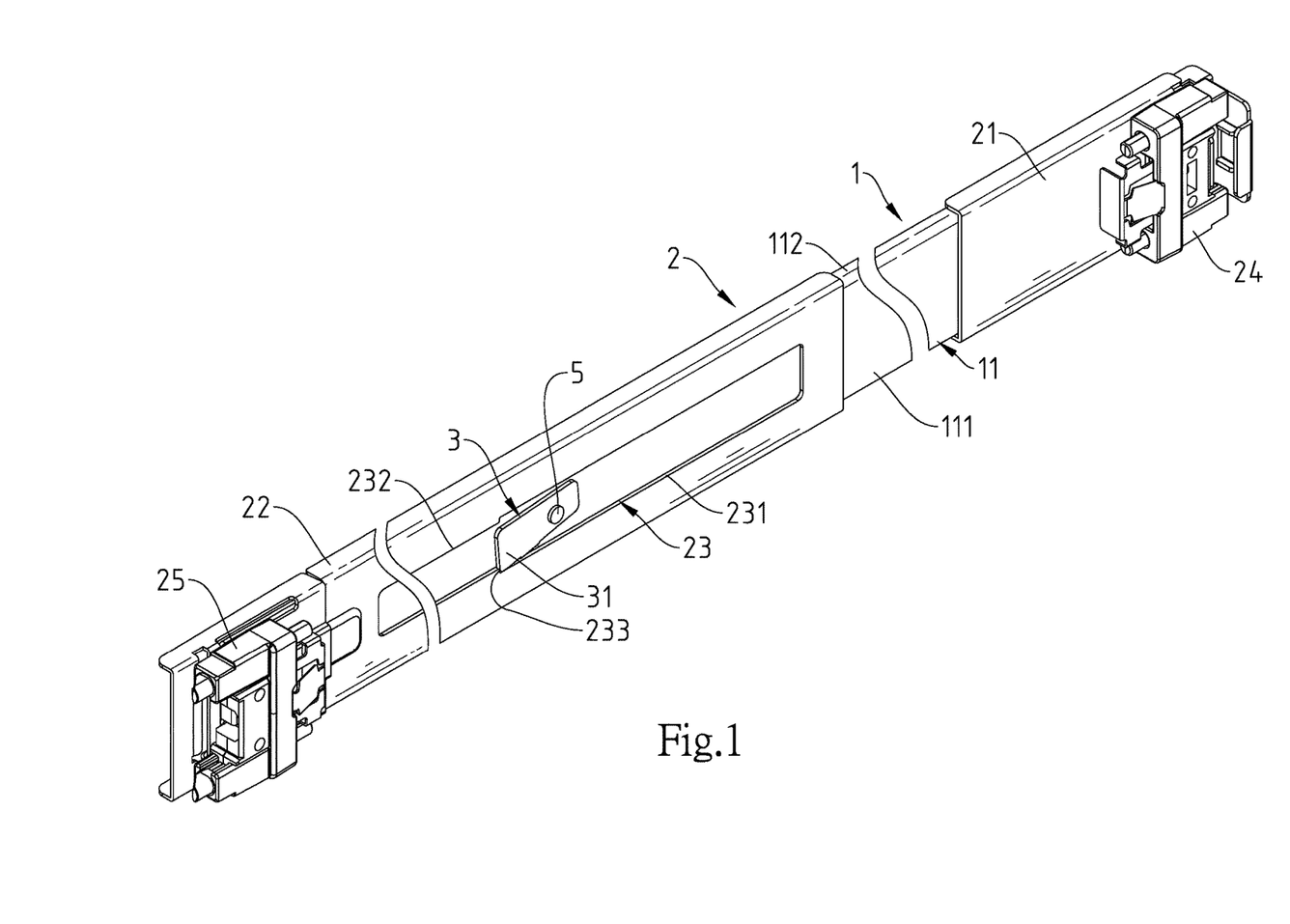
FIG. 1 is an oblique top elevational view of a slide rail displacement positioning mechanism in accordance with the present invention.
Figure 2:
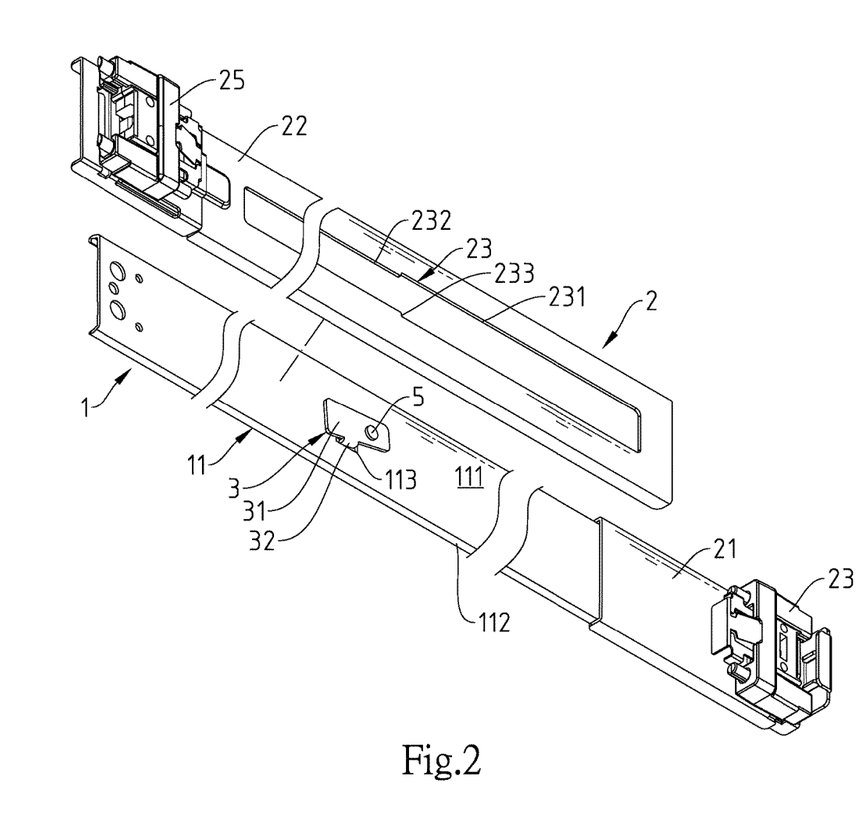
FIG. 2 is an exploded view of a part of the stent unit and the slide rail assembly of the slide rail displacement positioning mechanism in accordance with the present invention.
Figure 3:
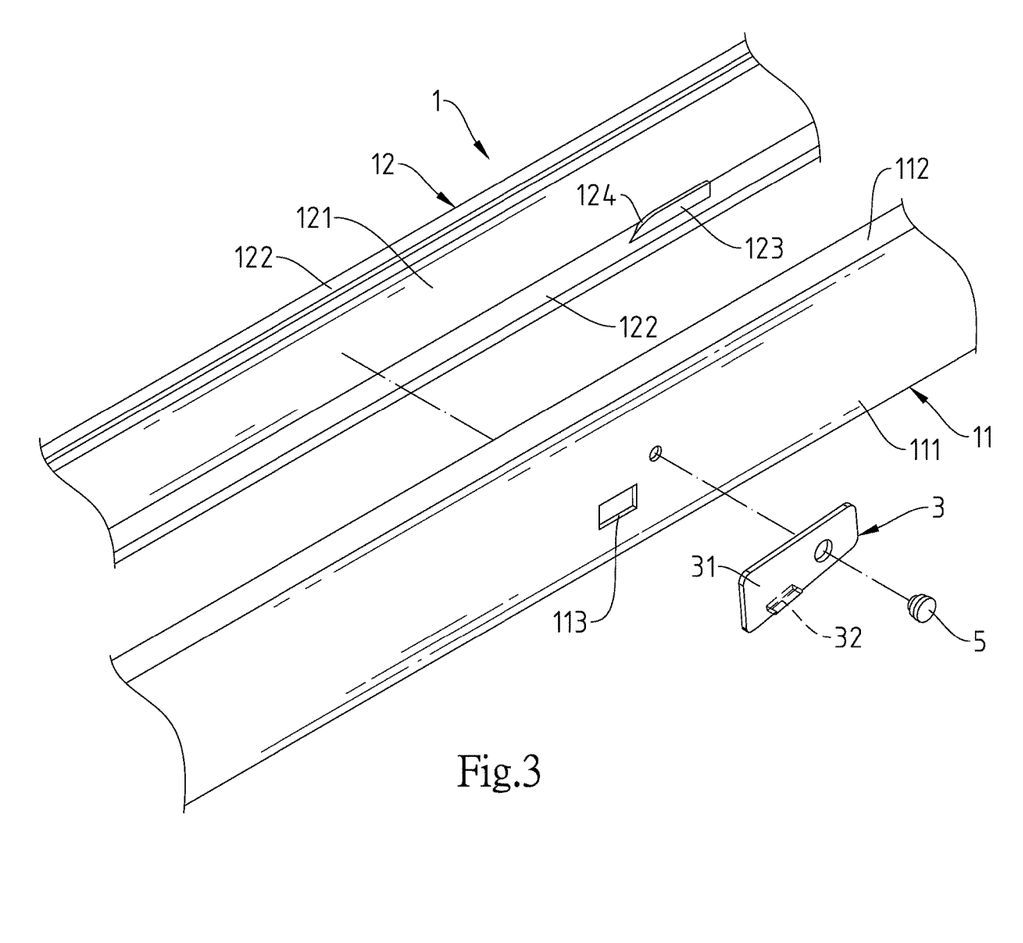
FIG. 3 is an exploded view of the slide rail assembly and positioning member of the slide rail displacement positioning mechanism in accordance with the present invention.

Referring to FIGS. 1-3, a server slide rail assembly mounting positioning mechanism in accordance with an embodiment of the present invention is shown. The server slide rail mounting positioning mechanism comprises a slide rail assembly 1, a stent unit 2 and a positioning member 3.

The slide rail assembly 1 comprises an outer slide rail 11 and an intermediate slide rail 12. The intermediate slide rail 12 is slidably coupled to and movable in and out of the outer slide rail 11. The outer slide rail 11 comprises an outer rail base wall 111, two outer rail side walls 112 respectively perpendicularly extended along two opposite lateral sides of the outer rail base wall 111, and a through hole 113 cut through the outer rail base wall 111. The intermediate slide rail 12 comprises an intermediate rail base wall 121, two intermediate rail side walls 122 respectively perpendicularly extended along two opposite lateral sides of the intermediate rail base wall 121, and a rib 123 located at a bottom side of the intermediate rail side wall 122 and defining a bevel guide edge 124. The two intermediate rail side walls 122 are respectively slidably abutted at respective inner surfaces of the outer rail side walls 112 for allowing the intermediate slide rail 12 to be smoothly moved in and out of the outer slide rail 11.

The stent unit 2 is mounted at an outer side of the outer slide rail 11 of the slide rail assembly 1 remote from the intermediate slide rail 12, comprising a first support member 21, a second support member 22, a first locating member 24 mounted at the first support member 21, and a second locating member 25 mounted at the second support member 22. The first support member 21 is affixed to one end of the outer slide rail 11. The second support member 22 is connected to an opposite end of the outer slide rail 11 remote from the first support member 21, and slidable in and out of the outer slide rail 11. The second support member 22 comprises a position-limiting slot 23. The position-limiting slot 23 defines an activity space 231 in one side thereof near the first support member 21, and a position-limiting space 232 in an opposite side thereof remote from first support member 21. Further, the width of the activity space 231 is larger than the width of the position-limiting space 232 so that a stop edge 233 is defined in the second support member 22 between the activity space 231 and the position-limiting space 232.

The positioning member 3 comprises a position-limiting plate 31, and an abutment plate 32 extended from the position-limiting plate 31. The position-limiting plate 31 is pivotally connected to the outer side of the outer slide rail 11 of the slide rail assembly 1 remote from the intermediate slide rail 12 by a pivot member 5 in such a manner that the position-limiting plate 31 is disposed in the position-limiting slot 23 of the stent unit 2 and the abutment plate 32 is inserted through the through hole 113 toward the intermediate slide rail 12. Further, the width of the position-limiting plate 31 is less than the width of the position-limiting space 232 of the position-limiting slot 23.

Figure 4:
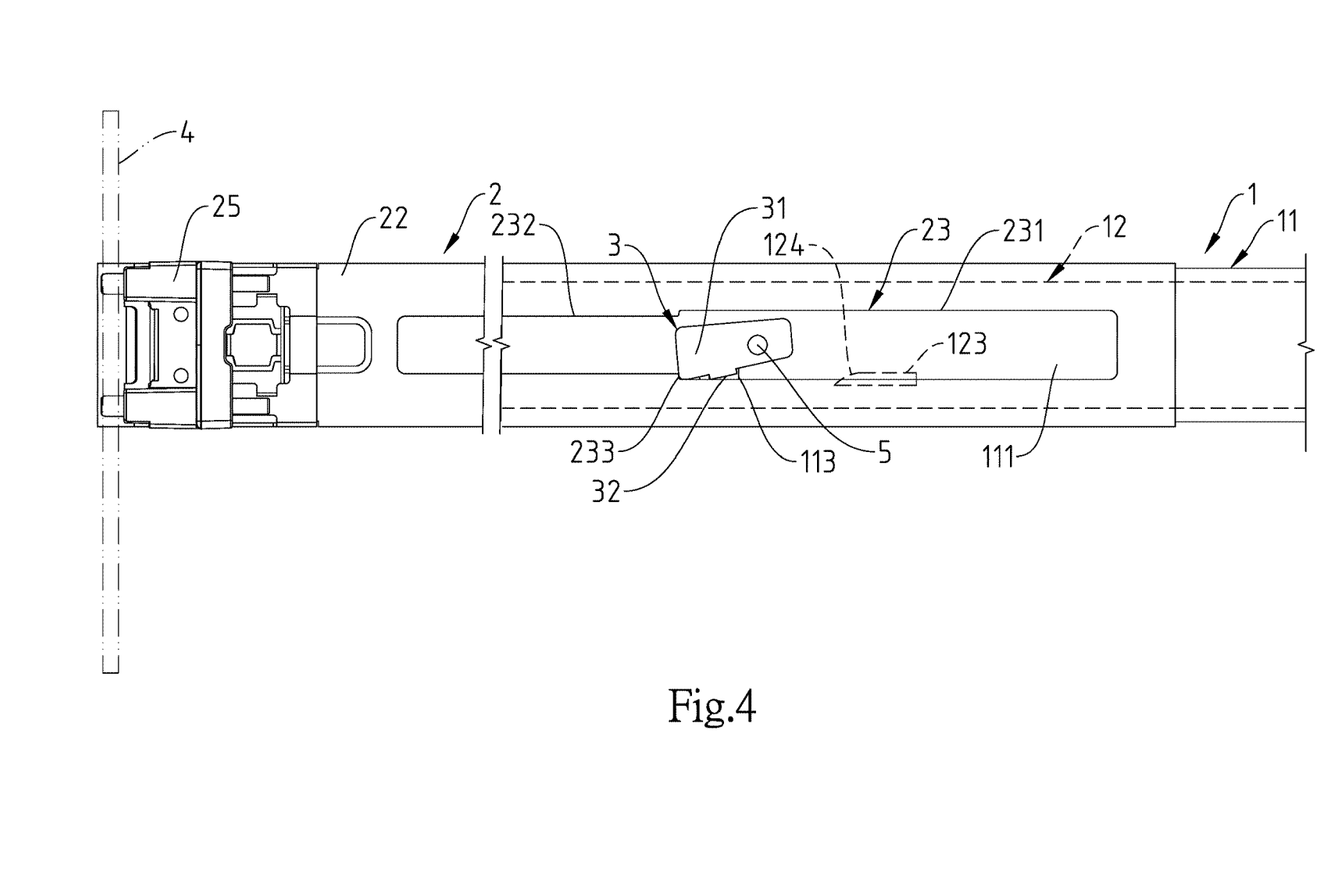
FIG. 4 is a schematic applied view of the present invention, illustrating the stent unit affixed to one bracket.
Figure 5:
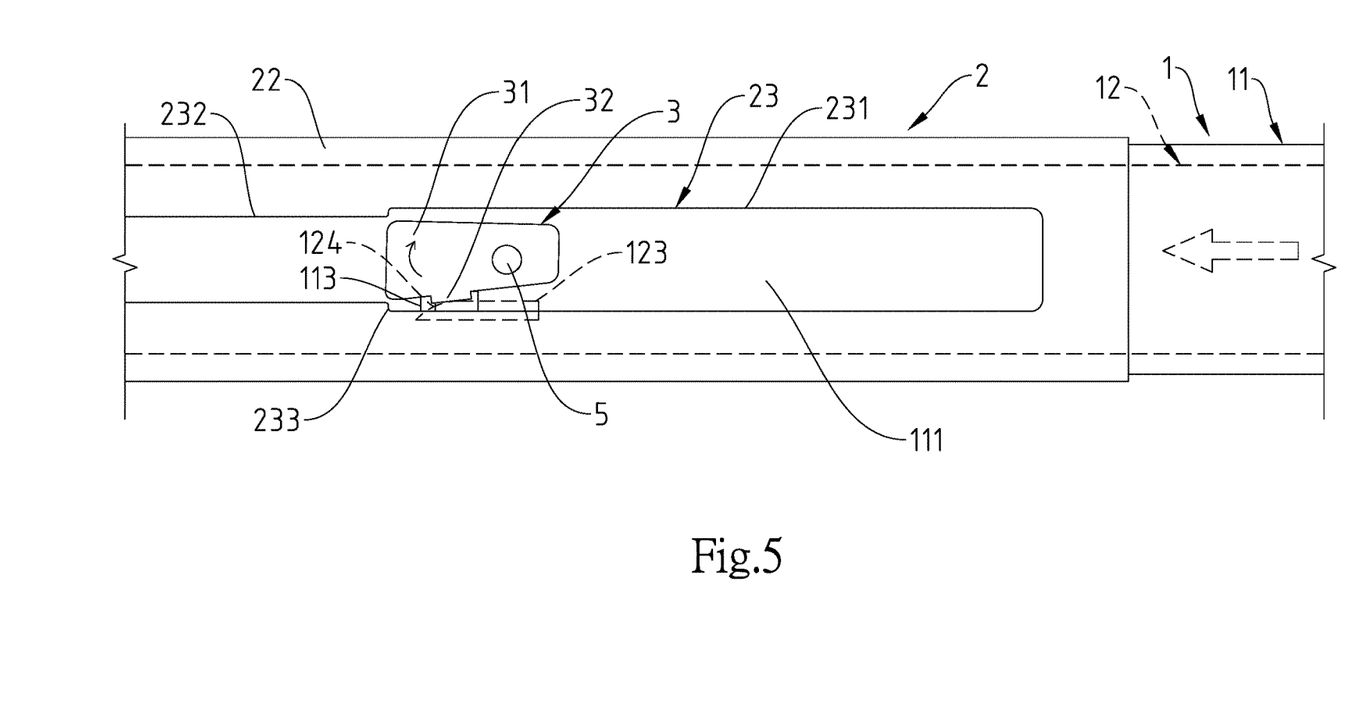
FIG. 5 is a schematic drawing of the present invention, illustrating the stent unit unlocked.
Figure 6:
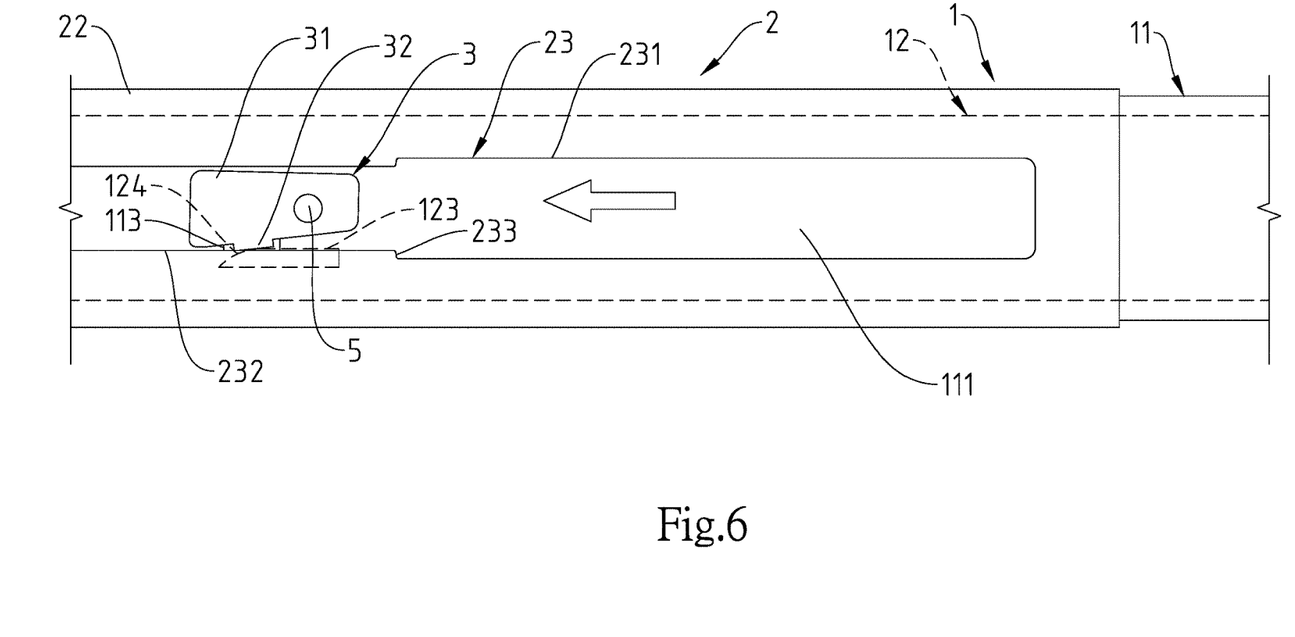
FIG. 6 is a schematic drawing of the present invention, illustrating the stent unit in the received status.
Figure 7:
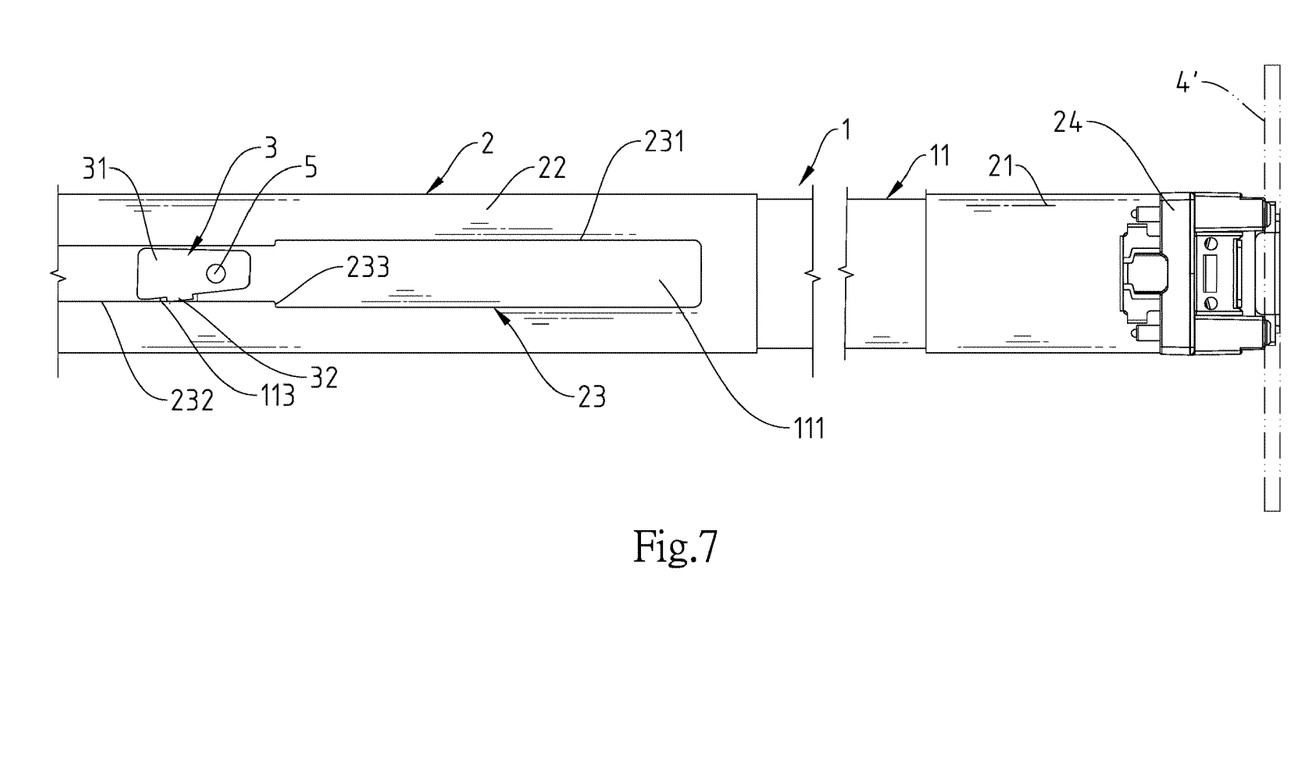
FIG. 7 is another schematic applied view of the present invention, illustrating the stent unit affixed to the opposing bracket.

Referring to FIGS. 1-7, as illustrated in FIG. 4, when mounting the stent unit 2 at a bracket (4,4') set, the outer slide rail 11 and intermediate slide rail 12 of the slide rail assembly 1 are in the received position, and then the second support member 22 of the stent unit 2 is pulled along the outer slide rail 11 in the direction away from the first support member 21 to carry the position-limiting plate 31 out of the position-limiting space 232 into the activity space 231. When biasing the position-limiting plate 31 to abut against a side edge of the activity space 231 at this time, the second support member 22 is moved along the outer slide rail 11 in a direction toward the first support member 21, the position-limiting plate 31 abuts against the stop edge 233 to lock the first support member 21 and the second support member 22 into position, and thus, the second locating member 25 of the second support member 22 can then be easily connected to the bracket 4. As illustrated in FIGS. 5-7, after connection of the second locating member 25 to the bracket 4, the intermediate slide rail 12 is pulled out of the outer slide rail 11 to force the bevel guide edge 124 of the rib 123 against the abutment plate 32, thereby lifting the position-limiting plate 31 from the stop edge 233 into alignment with the position-limiting space 232. At this time, the first support member 21 can be moved to carry the outer slide rail 11 toward the inside of the intermediate slide rail 12 for allowing adjustment of the width between the first locating member 24 and the second locating member 25 subject to the mounting design of the brackets (4,4') so that the first locating member 24 can be affixed to the bracket 4'.

What is claimed is:
1. A slide rail displacement positioning mechanism, comprising:
   a slide rail assembly comprising an outer slide rail and an intermediate slide rail axially slidably coupled to and movable in and out of said outer slide rail, said outer slide rail comprising a through hole, said intermediate slide rail comprising a rib located on a bottom wall thereof facing toward said outer slide rail;
   a stent unit mounted at an outer side of said outer slide rail of said slide rail assembly remote from said intermediate slide rail, said stent unit comprising a first support member affixed to an end of said outer slide rail and a second support member coupled to an opposite end of said outer slide rail remote from said first support member and movable in and out of said outer slide rail, said second support member comprising a position-limiting slot, said position-limiting slot comprising an activity space disposed near said first support member, a position-limiting space disposed in communication with a side of said activity space, and a stop edge defined between said activity space and said position-limiting space, a width of said activity space being larger than a width of said position-limiting space;
   a positioning member comprising a position-limiting plate and an abutment plate extending from said position-limiting plate, said position-limiting plate being pivotally connected to an outer side of said outer slide rail of said slide rail assembly remote from said intermediate slide rail in such a manner that said position-limiting plate is disposed in said position-limiting slot of said stent unit and said abutment plate is inserted through said through hole toward said intermediate slide rail, a width of said position-limiting plate being less than a width of said position-limiting space of said position-limiting slot; and
   when said second support member is extended along said outer slide rail in a direction away from said first support member, said position-limiting plate is moved out of said position-limiting space into said activity space to bias said position-limiting plate into abutment against a side edge of said activity space for allowing movement of said second support member along said outer slide rail in a direction toward said first support member so that when said position-limiting plate is abutted against said stop edge, said second support member is prohibited from movement toward said first support member and, when said intermediate slide rail is extended out of said outer slide rail, said rib is forced against said abutment plate to move said position-limiting plate away from said stop edge into alignment with said position-limiting space for allowing movement of said second support member along said outer slide rail toward said first support member.
2. The slide rail displacement positioning mechanism as claimed in claim 1, wherein said first support member of said stent unit comprises a first locating member for fixation to an external bracket; said second support member comprises a second locating member for fixation to another external bracket.

3. The slide rail displacement positioning mechanism as claimed in claim 1, wherein said rib of said slide rail assembly defines a bevel guide edge at one side thereof.

\* \* \* \* \*